(12) United States Patent
Ha et al.

(10) Patent No.: US 12,742,824 B2
(45) Date of Patent: Sep. 22, 2026

(54) METHOD AND SYSTEM FOR PREDICTING BEHAVIOR OF SECONDARY BATTERY ON BASIS OF PARAMETER MEASUREMENT

(71) Applicant: KOREA ELECTROTECHNOLOGY RESEARCH INSTITUTE, Changwon-si (KR)

(72) Inventors: Yoon-cheol Ha, Gimhae-si (KR); Seung-wook Eom, Changwon-si (KR); Chil-hoon Doh, Changwon-si (KR); Ji Hyun Yu, Changwon-si (KR); Hae Young Choi, Gimhae-si (KR)

(73) Assignee: KOREA ELECTROTECHNOLOGY RESEARCH INSTITUTE, Changwon-si (KR)

( * ) Notice: Subject to any disclaimer, the term of this patent is extended or adjusted under 35 U.S.C. 154(b) by 688 days.

(21) Appl. No.: 18/004,650

(22) PCT Filed: May 26, 2021

(86) PCT No.: PCT/KR2021/006530
§ 371 (c)(1),
(2) Date: Jan. 6, 2023

(87) PCT Pub. No.: WO2022/019463
PCT Pub. Date: Jan. 27, 2022

(65) Prior Publication Data

US 2023/0258727 A1 Aug. 17, 2023

(30) Foreign Application Priority Data

Jul. 24, 2020 (KR) ........................ 10-2020-0092304
May 24, 2021 (KR) ........................ 10-2021-0065952

(51) Int. Cl.
*G06F 11/30* (2006.01)
*G01R 31/36* (2020.01)
(Continued)

(52) U.S. Cl.
CPC ....... *G01R 31/374* (2019.01); *G01R 31/3646* (2019.01); *G01R 31/3648* (2013.01); *G01R 31/367* (2019.01); *G01R 31/388* (2019.01)

(58) Field of Classification Search
CPC .................................................... G01R 31/374
See application file for complete search history.

(56) References Cited

U.S. PATENT DOCUMENTS

2013/0166233 A1 6/2013 Suh et al.
2016/0266212 A1 9/2016 Carlo et al.
2017/0343612 A1 11/2017 Tagade et al.

FOREIGN PATENT DOCUMENTS

KR 10-0406796 B1 11/2003
KR 10-2013-0073802 A 7/2013
(Continued)

OTHER PUBLICATIONS

International Search Report for PCT/KR2021/006530 by Korean Intellectual Property Office dated Sep. 10, 2021.
(Continued)

*Primary Examiner* — Phuong Huynh
(74) *Attorney, Agent, or Firm* — BROADVIEW IP LAW, PC

(57) ABSTRACT

The present invention relates to a method and a system for predicting the behavior of a secondary battery on the basis of a parameter measurement, and a secondary battery behavior prediction system of the present invention comprises: a parameter tester, which is connected to a secondary battery cell to be tested so as to control the operation of the secondary battery cell, and thus calculates one or more pieces of parameter information associated with the performance, heating and deterioration of the secondary battery cell from the measured data; and a data processing device for predicting behavior information about the performance, heating and deterioration of the secondary battery cell
(Continued)

through behavior analysis based on the one or more pieces of parameter information received from the parameter tester.

12 Claims, 11 Drawing Sheets

(51) Int. Cl.
*G01R 31/367* (2019.01)
*G01R 31/374* (2019.01)
*G01R 31/388* (2019.01)

(56) References Cited

FOREIGN PATENT DOCUMENTS

KR 20130073802 A * 7/2013 ............. G01R 31/36
KR 10-2015-0141040 A 12/2015
KR 20150141040 A * 12/2015 ............... G01R 1/44
KR 10-2016-0041679 A 4/2016
KR 20160041679 A * 4/2016 ........... G01R 31/382
KR 10-1725514 B1 4/2017
WO 2019/199219 A1 10/2019

OTHER PUBLICATIONS

Yang, Naixing et al., "An improved semi-empricial model for thermal analysis of lithium-ion batteries,"Electrochimica Acta, vol. 311, pp. 8-20, DOI: 10.1016/j.electacta.2019.04.129, Jul. 2019.

Office Action for KR 10-2021-0065952 by Ministry of Intellectual Property dated Jun. 19, 2026.

* cited by examiner

- CONTROL OPERATION OF SECONDARY BATTERY CELL — S110
- ACQUIRE PARAMETER INFORMATION — S120
- ANALYZE BEHAVIOR WITH REFERENCE TO DB DATA — S130
- OBTAIN BEHAVIOR PREDICTION INFORMATION — S140

26
25
27
24
23
22
21
28
29

METHOD AND SYSTEM FOR PREDICTING BEHAVIOR OF SECONDARY BATTERY ON BASIS OF PARAMETER MEASUREMENT

CROSS-REFERENCE TO RELATED APPLICATIONS

This application is a National Phase Entry application of PCT Application No. PCT/KR2021/006530 filed on May 26, 2021, which claims priority to Korean Patent Application No. 10-2020-0092304 filed on Jul. 24, 2020, and Korean Patent Application No. 10-2021-0065952 filed on May 24, 2021, in Korean Intellectual Property Office, the entire contents of which are hereby incorporated by reference in its entirety.

TECHNICAL FIELD

The present disclosure relates to a secondary battery and, more particularly, to a method and a system (test platform) for predicting the behavior of a secondary battery, wherein electrochemical-thermal analysis of a secondary battery is performed by actually measuring parameters such that behaviors such as performance, heating, and deterioration are thereby predicted.

BACKGROUND ART

Demands for secondary batteries are expected to increase rapidly in line with growing markets of electric cars (xEV) and energy storage systems (ESS). According to SNE Research 2020, the scale of large battery cell markets is expected to rapidly grow from 126 GWh in 2020 to 3,147 GWh in 2030, and electric car markets are particularly expected to grow noticeably.

Meanwhile, secondary batteries for electric cars are sometimes required to have the following performance: batteries having an energy density per weight corresponding to three times the current level, and an energy density per volume corresponding to fourth times the current level, at a price half the current level, are expected to be produced. Such high energy densities may increase the traveling distance per charging, thereby reducing the total number of times of charging/discharging (cycle life). However, the output density and stability are inversely proportional to the energy density and need to maintain the current levels or higher, while improving low-temperature characteristics, and the rapid charging current needs to increase three times the current level. As such, performances having a trade-off are required to be improved.

In order to satisfy the level of industrial demands for secondary batteries, such as increased energy density per weight and increased energy density per volume, increased cycle life, increased output density and stability, improved low-temperature characteristics, and increased rapid charging current, technical innovation is necessary across battery materials and electrode and cell process technologies. Such technical innovation requires a multiscale computational analysis-based prediction technology such that initial and long-term performances of secondary batteries can be predicted through modeling and computational analysis regarding multi-physical phenomena in the material/electrode/cell/module, and can be optimized according to industrial usages. Most battery system manufacturers currently apply, as a computational analysis technology regarding lithium ion batteries, an equivalent circuit method (ECM) in which a battery is simulated as a simple electric circuit. Electrochemical models (Newman P2D etc.) based on an actual multiscale physicochemical theory (governing equation) are useful for predicting various physical phenomena occurring in the active material/electrode/electrolyte, but cannot perform cell/module-based analysis within a short period of time, thus are not utilized by actual system manufacturers, and are competitively implemented in expensive commercial multi-physical software packages such as COMSOL, ANSYS Fluent, Star CCM+.

Meanwhile, as a test for evaluating and predicting the performance and lifespan of a secondary battery, it is necessary to secure data through long-term experiments by applying a charging/discharging pattern conforming to the actual use environment. However, this method requires a long time, a high test cost, and a large amount of labor, and most users thus determine system design and operating conditions on the basis of basic test data provided by manufacturers. Such a scheme has difficulty in predicting performance deterioration depending on the use environment, and resulting lifespan, safety, etc. as secondary batteries are variously utilized in fields related to electric cars (xEV), energy storage systems (ESS), and IT. That is, there is a problem in that, although battery manufacturers provide information regarding secondary batteries such as size, weight, capacity, internal resistance, discharge ratio (C-rate), specific energy (energy per unit mass), and positive electrode material type, users cannot predict heating and deterioration characteristics depending on the secondary battery charging/discharging pattern in a cell or a module (for example, pack/rack) operating in an actual environment, and the secondary battery may thus abruptly fail to operate.

DISCLOSURE OF INVENTION

Technical Problem

Therefore, the present disclosure has been made to solve the above-mentioned problems, and it is an aspect of the present disclosure to provide a method and a system (test platform) for predicting the behavior of a secondary battery, wherein electrochemical-thermal analysis of a secondary battery is performed by actually measuring parameters from a series of charging/discharging tests based on a semi-empirical analysis model (Newman-Tiedemann-Gu-Kim (NTGK)) of cells, module units, etc. such that behaviors such as performance, heating, and deterioration are predicted, thereby guiding secondary battery technical innovation and next-generation battery development, providing design convenience for performance improvement, optimizing operations against heating and deterioration, predicting the lifespan of a secondary battery or the time to replace the same, and preventing accidents due to heating and deterioration.

Solution to Problem

To summarize features of the present disclosure, in accordance with an aspect of the present disclosure, a secondary battery behavior prediction system may include: a parameter tester connected to a test target secondary battery cell and configured to obtain one or more pieces of parameter information related to performance, heating, and deterioration of the secondary battery cell from data measured by controlling operations of the secondary battery cell; and a data processing device configured to perform behavior analysis based on the one or more pieces of parameter information received from the parameter tester, thereby generating behavior information regarding performance, heating, and deterioration of the secondary battery cell.

The secondary battery behavior prediction system may further include a temperature setup/display unit for temperature setup and temperature display regarding the secondary battery cell.

The secondary battery behavior prediction system may further include a jig including a heating/cooling unit controlled by a control device according to the temperature setup and a temperature measuring unit configured to transmit a measurement signal regarding the secondary battery cell for the temperature display to the control device, the secondary battery cell being disposed between the heating/cooling unit and the temperature measuring unit.

The heating/cooling unit disposed below the secondary battery cell may include a Peltier element array configured to operate in response to the temperature setup, and the temperature measuring unit disposed above the secondary battery cell may include a thermocouple array configured to generate a signal serving as a basis of local temperature measurement of the secondary battery cell.

The heating/cooling unit may include a cooling medium circulating motor subjected to operation control of the control device according to the temperature that has been set and a measurement temperature regarding the secondary battery cell, and operations of the motor, a cooling medium may circulate through a channel inside a plate included in the heating/cooling unit disposed below the secondary battery cell.

The heating/cooling unit may include: a heat dissipation plate disposed below the Peltier element array; and an aluminum plate, a heat diffusion plate, and a cell heating block stacked above the Peltier element array.

The heating/cooling unit may further include a thermocouple installed on the cell heating block so as to display a corresponding temperature on the temperature setup/display unit through temperature monitoring.

The secondary battery behavior prediction system may further include a chamber configured to contain the secondary battery cell, and the temperature inside the chamber may be maintained in a convection type by controlling activation of a heater or a cooling device installed around the chamber according to the temperature setup.

The secondary battery behavior prediction system may further include an infrared camera for temperature measurement regarding the secondary battery cell.

The parameter tester may acquire the parameter information regarding performance, heating, and deterioration by using a series of time-dependent charging/discharging patterns of the secondary battery cell with regard to two or more time-dependent current conditions.

The parameter tester may acquire the parameter information with regard to the two or more time-dependent current conditions for each setup temperature with regard to multiple setup temperatures.

The parameter information regarding performance, heating, and deterioration may include one or more pieces of parameter information among parameter information regarding cell open circuit voltage (U), capacity (Q), cell conductance (Y), cell capacitance (Cd1), cell entropy (ΔS), external temperature influence (C1, C2), and deterioration (A1, A2).

For the behavior analysis, the data processing device may apply the one or more pieces of parameter information to a semi-empirical electrochemical-thermal model regarding the secondary battery cell, thereby performing the behavior analysis.

The secondary battery behavior prediction system may further include a basic parameter database configured to store basic parameter information of the secondary battery cell for generating the behavior information, and the data processing device may refer to the basic parameter database and obtain the behavior information regarding performance, heating, and deterioration by using the one or pieces of parameter information received from the parameter tester.

The basic parameter information is information obtained from a geometrical structure of a constituent material of the secondary battery cell, and may include at least one of density (ρ), specific heat (Cp), thermal conductivity (k), electrode plate resistance (rp, rn), specific surface area (a, ap, an), and heat transfer coefficient associated with a temperature measuring unit regarding the secondary battery cell.

The data processing device may predict, as the behavior information regarding performance, heating, and deterioration, at least one of a charging/discharging pattern, the number of cycles, the time of use, an open circuit voltage (OCV)-capacity curve according to environment temperature, a closed circuit voltage (CCV)-capacity curve, remaining lifespan (RUL), and a two-dimensional or three-dimensional temperature distribution.

In accordance with another aspect of the present disclosure, a secondary battery behavior prediction method may include: by using a parameter tester connected to a test target secondary battery cell, obtaining one or more pieces of parameter information related to performance, heating, and deterioration of the secondary battery cell from data measured by controlling operations of the secondary battery cell; and by using a data processing device, performing behavior analysis based on the one or more pieces of parameter information received from the parameter tester, thereby generating behavior information regarding performance, heating, and deterioration of the secondary battery cell.

In accordance with another aspect of the present disclosure, a secondary battery behavior prediction system may include: a jig configured to mount and retain a test target secondary battery cell therein; a parameter tester connected to the secondary battery cell and configured to obtain parameter information regarding the secondary battery cell from data measured by controlling operations of the secondary battery cell; and a data processing device configured to perform behavior analysis based on parameter information received from the parameter tester, thereby generating behavior information regarding the secondary battery cell.

The jig may include: a plate configured such that the secondary battery cell is seated on an upper portion thereof; a cover portion coupled to the plate so as to cover the secondary battery cell; and a Peltier element array provided on the plate portion, and including multiple Peltier elements arranged so as to heat or cool the secondary battery cell.

The Peltier element array may include multiple Peltier elements arranged in an N×M shape (N, M are natural numbers), and the multiple Peltier elements may perform heat transfer by means of conduction with regard to the secondary battery cell.

The plate may further include a cooling channel therein so as to extend below the Peltier element array. The cover portion may further include a temperature measuring unit configured to measure temperatures of the secondary battery cell. The temperature measuring unit may measure temperatures at respective points on the secondary battery cell corresponding to positions of the Peltier elements.

Advantageous Effects of Invention

A method and a system for secondary battery behavior prediction according to the present disclosure may provide a test platform (hardware+software) capable of predicting charging/discharging characteristics of a commercially available secondary battery cell, and heating and deterioration characteristics thereof. That is, electrochemical-thermal analysis of a secondary battery may be performed by using parameters measured by a parameter tester, and behavior following the performance, heating, and deterioration characteristics of the secondary battery may be predicted thereby. In addition, based on the secondary battery behavior prediction, a system such as a secondary battery pack or rack can be easily designed by serial/parallel connection of secondary battery cells or modules.

A method and a system for secondary battery behavior prediction according to the present disclosure may predict behavior following the performance, heating, and deterioration characteristics of a secondary battery, thereby guiding secondary battery technical innovation and next-generation battery development, such as increased number of times of charging/discharging, increased output density and stability, improved low-temperature characteristics, and increased rapid charging current, and providing a tool such that technical dominance is ensured in the ever-accelerating global competition in the battery industry.

A method and a system for secondary battery behavior prediction according to the present disclosure apply an interpretation method for improving the reliability of an electrochemical-thermal model, and electrochemical/thermochemical model parameter extraction is used in this connection, thereby enabling simulation by securing a series of initial parameters within a short period of time. That is, an interpretation method based on an electrochemical-thermal model and electrochemical/thermochemical model parameter extraction technology are applied in the field of battery performance evaluation and prediction such that the lifespan of the secondary battery or the time to replace the same can be quickly predicted, and it is possible to develop batteries and to analyze the cause of abnormal behavior with the resulting feedback.

Furthermore, model parameters secured from conventionally measurable data such as current, voltage, temperature, and capacity can be instantly provided as simulation input values through a test platform of the present disclosure, and the lifespan of a secondary battery or the time to replace the same can be predicted within a minimum time through a series of test processes. In addition, and it is possible to develop batteries and to analyze the cause of abnormal behavior from the resulting feedback, and the occurrence of accidents due to heating or deterioration of a secondary battery can be prevented.

In addition, the present disclosure predicts not only initial charging/discharging characteristics or heating characteristics, but also mid/long-term performance deterioration and heating characteristic changes occurring in actual operating environments such that, by adjusting short/mid/long-term operating parameters, deterioration and heating characteristics can be improved, and operation optimization for extended lifespans are possible.

BRIEF DESCRIPTION OF DRAWINGS

The accompanying drawings included as a part of the detailed description for helping understanding of the present disclosure provide embodiments of the present disclosure and illustrate the technical idea of the present disclosure together with the detailed description.

BEST MODE FOR CARRYING OUT THE INVENTION

Figure 1:
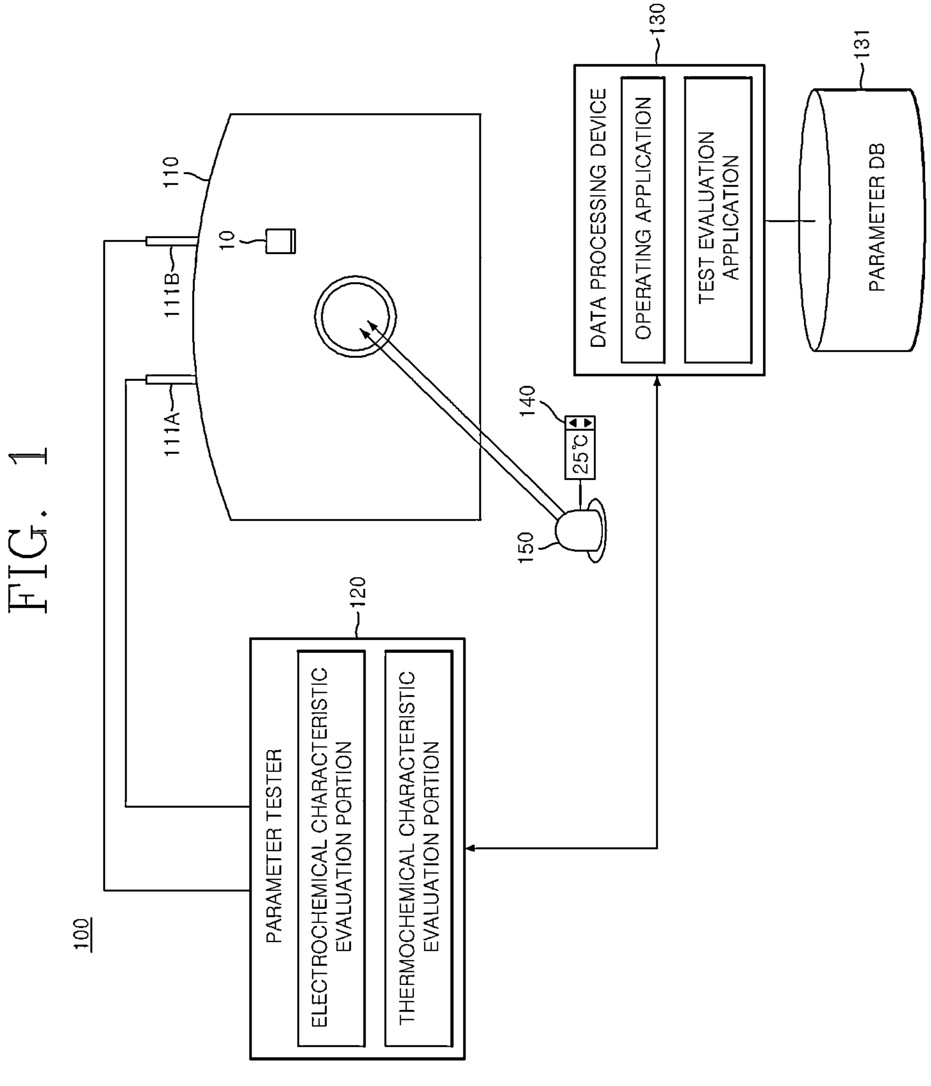
FIG. 1 illustrates a secondary battery behavior prediction system according to an embodiment of the present disclosure.

Hereinafter, the present disclosure will be described in detail with reference to the accompanying drawings. In respective drawings, identical components are indicated by identical reference numerals if possible. In addition, detailed descriptions of already known functions and/or configurations will be omitted herein. The following descriptions will be focused on parts necessary to understand operations according to various embodiments, and descriptions of elements that may obscure the gist of descriptions will be omitted. Some components in the drawings may be exaggerated, omitted, or schematically illustrated. The size of each component does not entirely reflect the actual size, and the relative size or the interval between components illustrated in respective drawings thus does not limit the disclosure herein.

In connection with describing embodiments of the present disclosure, detailed descriptions of the prior art related to the present disclosure, if deemed to unnecessarily obscure the gist of the present disclosure, will be omitted herein. In addition, terms used herein are defined in view of functions in the present disclosure, and may vary depending on the intents or customs of users or operators. Therefore, definitions thereof need to be made on the basis of the overall context of the present disclosure. Terms used in the detailed description are only for describing embodiments of the present disclosure, and are not to be deemed limiting. Unless otherwise specified, expressions in singular forms include meanings in plural forms. As used herein, expressions such as “include” or “have” denote specific features, numbers, steps, operations, elements, or a part or a combination thereof, and are not to be interpreted as excluding one or more other features, numbers, steps, operations, elements, or a part or a combination thereof in addition to the described ones.

In addition, terms such as “first” and “second” may be used to described various components, but the components are not limited by such terms, and the terms are used only to distinguish a component from another.

FIG. 1 illustrates a secondary battery behavior prediction system (test platform) 100 according to an embodiment of the present disclosure.

Referring to FIG. 1, the secondary battery behavior prediction system 100 according to an embodiment of the present disclosure includes a chamber 110, a parameter tester 120, a data processing device 130, a basic parameter database (DB) 131 in which basic parameter information is stored, and a temperature setup/display unit 140. A test target secondary battery cell (for example, pouch cell) 10 is contained in the chamber 110. As will be described later with reference to FIG. 4A to FIG. 4C, the secondary battery cell 10 may be fixed to a predetermined jig 50 and disposed in the chamber 110. A heating/cooling unit 20 (for example, Peltier element, cooling means, etc.) may be positioned below the jig 50, and a temperature measuring unit 30 (for example, thermocouple) may be positioned above the jig 50.

The jig 50 can retain the secondary battery cell 10 and maintain the temperature of the secondary battery cell 10 in a conduction type, and may thus contain the secondary battery cell 10 independently without the chamber 110. In some cases, the jig 50 may be contained in the chamber 110.

The secondary battery behavior prediction system 100 according to an embodiment of the present disclosure may be expansively applied to a module, a pack, or a rack in addition to a secondary battery cell. The secondary battery behavior prediction system 100 of the present disclosure provides a test platform (hardware+software) capable of automatically predicting charging/discharging characteristics of a secondary battery cell 10 which is commercially new product, or which has been used, that is, performances such as the capacity and voltage change in response to various amounts of input/output currents, and heating and deterioration characteristics. Parameters of multiple secondary battery cells 10 disposed on the jig 50 including the heating/cooling unit 20 and the temperature measuring unit 30 may be tested one after another, and the behavior thereof may be analyzed and predicted. In addition, the secondary battery behavior prediction system 100 of the present disclosure may test parameters of the corresponding configured system and may analyze and predict the behavior thereof such that design can be easily made even in the case of configuring a module, a pack, or a rack by serial/parallel disposition of secondary battery cells 10.

The secondary battery behavior prediction system 100 of the present disclosure may perform electrochemical-thermal analysis of a secondary battery by actually measuring parameters with the parameter tester 120, thereby predicting behaviors such as performance and heating and deterioration characteristics. Accordingly, secondary battery charging/discharging characteristics, that is, performances such as the capacity and voltage change in response to various amounts of input/output currents, are improved, the number of times of charging/discharging is increased, the output density and stability are increased, low-temperature characteristics are improved, and the rapid charging current is increased. As such, secondary battery technical innovation and next-generation battery development are guided, and a tool may be provided such that technical dominance is ensured in the ever-accelerating global competition in the battery industry.

Figures 2, 3:
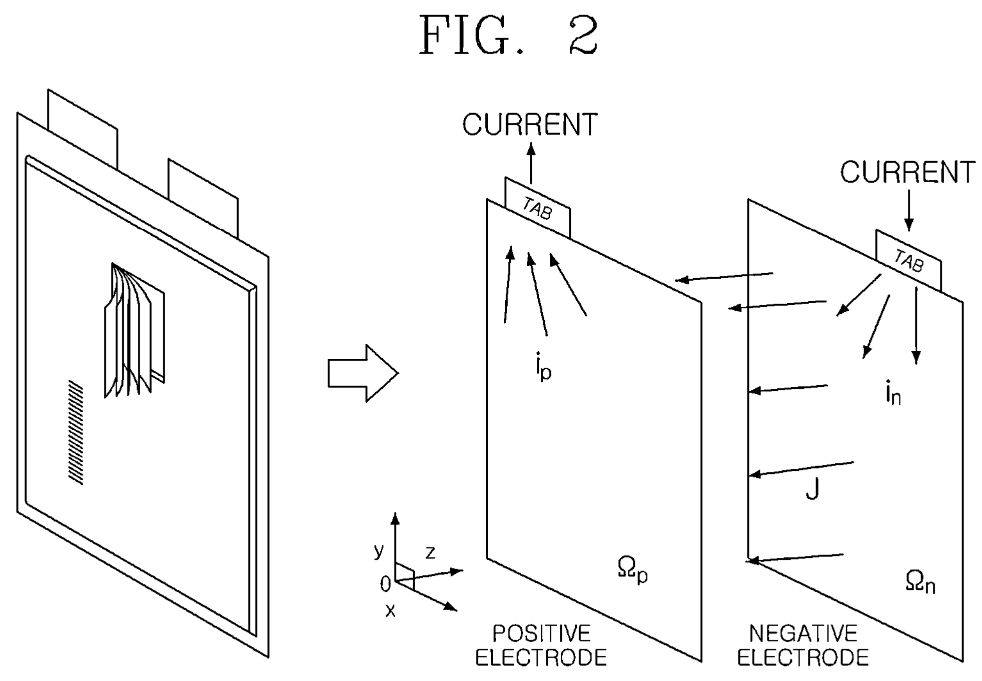
FIG. 2 illustrates semi-empirical electrochemical-thermal modeling regarding a secondary battery cell applied to a secondary battery behavior prediction system of the present disclosure.
FIG. 3 is a flowchart illustrating operations of a secondary battery behavior prediction system according to an embodiment of the present disclosure.

FIG. 2 illustrates semi-empirical electrochemical-thermal modeling regarding a secondary battery cell 10 applied to the secondary battery behavior prediction system 100 of the present disclosure.

Referring to FIG. 2, in the data processing device 130, a semi-empirical two-dimensional model (NTGK model etc.) based on test data regarding secondary battery cells may be applied to a secondary battery cell 10 such that local current, voltage, heating, etc. can be predicted.

In general, in the case of a prediction model based on an electric equivalent circuit, performance and lifespan are predicted, on the basis of parameters such as the voltage (Vs) of the secondary battery cell 10, the electrode internal resistance (R1), the electrolyte internal resistance (R2), the electrode capacitance, the electrolyte capacitance, and the output impedance (Ry). In the case of an electrochemical model, the law of energy conservation, the law of mass conservation, Butler-Volmer equation, etc. serve as a basis such that characteristics such as the size ($L_{pP}$, $L_W$, $L_N$ etc.) or material of electrodes (positive electrode, negative electrode) of the secondary battery cell 10 are considered and reflected. Elements of the equivalent circuit can be added or changed according to the design so as to conform to various characteristics of the secondary battery cell 10, and design of the governing equation may be changed and used each time according to the equivalent circuit and the electrochemical equivalent model (one-dimensional, two-dimensional, or three-dimensional model) in view of an additional consideration (for example, an additional element is added such that a difference in extracted parameter due to the material, shape, etc. of the secondary battery can be compensated for).

Meanwhile, an equivalent circuit model has simplicity and quick operations, but cannot easily predict physical changes occurring inside cells. An electrochemical model can predict various physical phenomena, but has slow operations, thereby posing a problem in that the same is hardly commercially available. In contrast, the Newman-Tiedemann-Gu-Kim (NTGK) model is a semi-empirical two-dimensional electrochemical-thermal model based on test data regarding secondary battery cells, and can be applied more conveniently to predict performance, heating, and deterioration.

Specifically, in the case of a method and a system for predicting the behavior or a secondary battery of the present disclosure, which is based on parameter measurement by applying the NTGK model, the parameter tester 120 may perform measurement regarding a secondary battery cell 10 and acquisition of parameter information by using electrode terminals 111A, 111B. Thereafter, the data processing device 130 may apply the NTGK model on the basis of basic parameter information in the basic parameter DB 131 and parameter information acquired by the parameter tester 120. That is, the NTGK model may be used to identify the charging/discharging behavior regarding the secondary battery cell 10 and the current density distribution, potential distribution, etc. of electrodes (positive electrode, negative electrode) of the secondary battery cell 10, and characteristics such as the position-specific local current, voltage, and heating of the secondary battery cell 10 may be analyzed thereby.

Hereinafter, operations of the secondary battery behavior prediction system 100 according to an embodiment of the present disclosure will be described in detail with reference to the flowchart in FIG. 3.

FIG. 3 is a flowchart illustrating operations of the secondary battery behavior prediction system 100 according to an embodiment of the present disclosure.

Referring to FIG. 3, a test target secondary battery cell 10 is first disposed in the chamber 110.

Alternatively, when the jig 50 is used as will be described later with reference to FIG. 4A to FIG. 4C, the secondary battery cell 10 (for example, pouch cell), the behavior of which is to be predicted, is retained by the jig 50. It is also possible to dispose the jig 50 which retains the secondary battery cell 10 in the chamber 110.

It will be assumed, for example, in the following description that, when the chamber 110 is used, the jig 50 is not contained in the chamber 110, and the secondary battery cell 10 (for example, pouch cell) is retained and disposed in the chamber 110 in a predetermined type.

Next, the temperature setup/display unit 140 may perform temperature setup and temperature display for heating or cooling the secondary battery cell 10, and the temperature setup/display unit 140 may be installed in an appropriate position outside the chamber 110 or the jig 50. After the temperature setup/display unit 140 sets a temperature, the secondary battery cell 10 may be maintained at a predetermined temperature in a conductive or convective type under the control of a predetermined control device (not illustrated).

When a secondary battery (for example, pouch cell) 10 is disposed in the chamber 110 without a jig 50, activation of a heater or a cooling device (a channel for circulating a cooling medium such as cooling water, pump, etc.) installed around the chamber 110 may be controlled so as to maintain the temperature in the chamber 110 in a convection type. A warm/hot air stream may be supplied from the heater to the chamber 110 through an induction tube.

When a jig 50 is used as will be described later with reference to FIG. 4A to FIG. 4C, a predetermined control device (not illustrated) may control the heating/cooling unit 20 (for example, Peltier element, cooling means, etc.) according to the temperature setup of the temperature setup/display unit 140, and the heating/cooling unit 20 may maintain the setup temperature of the secondary battery cell 10 through conduction-type heating or cooling. That is, if the user inputs the necessary temperature to the temperature setup/display unit 140 and turns on the same, the predetermined control device (not illustrated) may be connected to the heating/cooling unit 20 (for example, Peltier element, cooling means, etc.) and the temperature measuring unit 30 through multiple cables and terminals (not illustrated), thereby performing necessary control regarding the same.

While the behavior of the secondary battery is predicted, the temperature measuring unit 30 may transmit a measurement signal to the predetermined control device (not illustrated), and the temperature setup/display unit 140 may display the corresponding temperature of the secondary battery cell 10 through the display.

In some embodiments, an infrared camera 150 may be further provided besides the temperature measuring unit 30, in order to acquire the temperature of the inside of the chamber 110 or the temperature of the secondary battery cell 10.

The parameter tester 120 may have a terminal cable connected to electrode terminals (for example, feedthrough terminal) 111A, 111B exposed out of the chamber 110 and connected to electrodes (positive electrode, negative electrode) of the secondary battery cell 10 (when a jig 50 is used, the same is connected to the parameter tester 120 through pin housings 41, 42 of the jig 50). If the temperature of the inside of the chamber 110 or the temperature of the secondary battery cell 10 reaches a setup temperature as a result of such an operation of the temperature setup/display unit 140, the parameter tester 120 controls operations of the secondary battery cell 10 by using a unit for electrochemical characteristic evaluation (for example, charging/discharging unit, cyclic voltammetry, etc.) (S110). The parameter tester 120 controls charging/discharging of the secondary battery cell 10 by using two or more time-dependent current conditions, that is, two or more C-rates (c-rate curves different from each other), with regard to each of multiple setup temperatures, thereby measuring data, such as charging/discharging patterns, including the time-dependent voltage and capacity of the secondary battery cell 10. For example, among units for electrochemical characteristic evaluation, a charging/discharging unit may be used to control the depth of discharge (DO) step-specific (%) charging/discharging of the secondary battery cell 10, and a cyclic voltammetry among the units for electrochemical characteristic evaluation may be used to apply a scanning voltage in a predetermined voltage range in order to measure the current in the secondary battery cell 10.

The parameter tester 120 obtains one or more pieces of parameter information related to the secondary battery cell 10 from the time-dependent voltage and capacity of the secondary battery cell 10, acquired through measurement at the corresponding setup temperature (S120). For example, by using a series of time-dependent charging/discharging patterns of the secondary battery cell 10/module, the parameter tester 120 may acquire the parameter information regarding performance (cell open circuit voltage U, capacity Q, etc.), heating (cell conductance Y, cell capacitance $C_{dl}$, cell entropy ΔS, etc.), external temperature influence (parameter C1 related to change in cell conductance Y according to external temperature, parameter C2 related to change in cell open circuit voltage U according to external temperature), and deterioration (parameter A1 related to change in capacity Q according to cycle, parameter A2 related to change in cell conductance according to cycle).

The parameter tester 120 transmit the parameter regarding performance (cell open circuit voltage U, capacity Q, etc.), heating (cell conductance Y, cell capacitance $C_{dl}$, cell entropy ΔS, etc.), external temperature influence (C1, C2), and deterioration (A1, A2) acquired in this manner to the data processing device 130.

The data processing device 130 includes a part for processing operating applications (for example, hardware signal, software command, etc.) for overall operation-related control for interworking with the parameter tester 120, and a simulation software part for processing parameter information received from the parameter tester 120 and performing behavior analysis.

By using such operating applications and simulation software, the data processing device 130 processes parameter information received from the parameter tester 120, and performs behavior analysis (simulation) by utilizing the received parameter information together with information stored in the basic parameter DB 131 (S130), thereby predicting behavior information regarding the performance, heating, and deterioration of the secondary battery cell 10, and obtaining necessary information (S140). The behavior information regarding the performance, heating, and deterioration of the secondary battery cell 10 includes, for example, charging/discharging patterns, the number of cycles, the time of use, an open circuit voltage (OCV)-capacity curve according to environment temperature, a closed circuit voltage (CCV)-capacity curve, remaining lifespan (RUL), a two-dimensional or three-dimensional temperature distribution, etc.

The parameter DB 131 has basic parameter information pre-stored therein. That is, the basic parameter information is derived from the geometric structure of the secondary battery cell 10 and the constituent materials thereof, and includes density (ρ), specific heat ($C_p$), thermal conductivity (k), electrode plate resistance (positive electrode plate resistance $r_p$, negative electrode plate resistance $r_n$), specific surface area (entire cell specific area α, positive electrode plate surface area $\alpha_p$, negative electrode plate surface area $\alpha_n$), convective heat transfer coefficient (h) associated with forced convection of air inside the chamber 110, or a parameter related to heat transfer of the jig 50 including the heating/cooling unit 20 and the temperature measuring unit 30.

The data processing device 130 refers to the basic parameter DB 131 and, with regard to parameter information received from the parameter tester 120, performs behavior analysis regarding the performance, heating, and deterioration of the secondary battery cell 10 (S130). For example, for the sake of behavior analysis, the data processing device 130 may apply the above-mentioned parameter information (for example, parameter information regarding performance (cell open circuit voltage U, capacity Q, etc.), heating (cell conductance Y, cell capacitance $C_{dl}$, cell entropy ΔS, etc.), external temperature influence (C1, C2), deterioration (A1, A2), etc.) to a semi-empirical electrochemical-thermal model (NTGK model etc.) regarding the secondary battery cell 10, thereby performing behavior analysis. Accordingly, the data processing device 130 may obtain, for example, charging/discharging patterns, the number of cycles, the time of use, an open circuit voltage (OCV)-capacity curve according to environment temperature, a closed circuit voltage (CCV)-capacity curve, remaining lifespan (RUL), a two-dimensional or three-dimensional temperature distribution, etc. as behavior information regarding performance, heating, and deterioration.

Figure 4A:
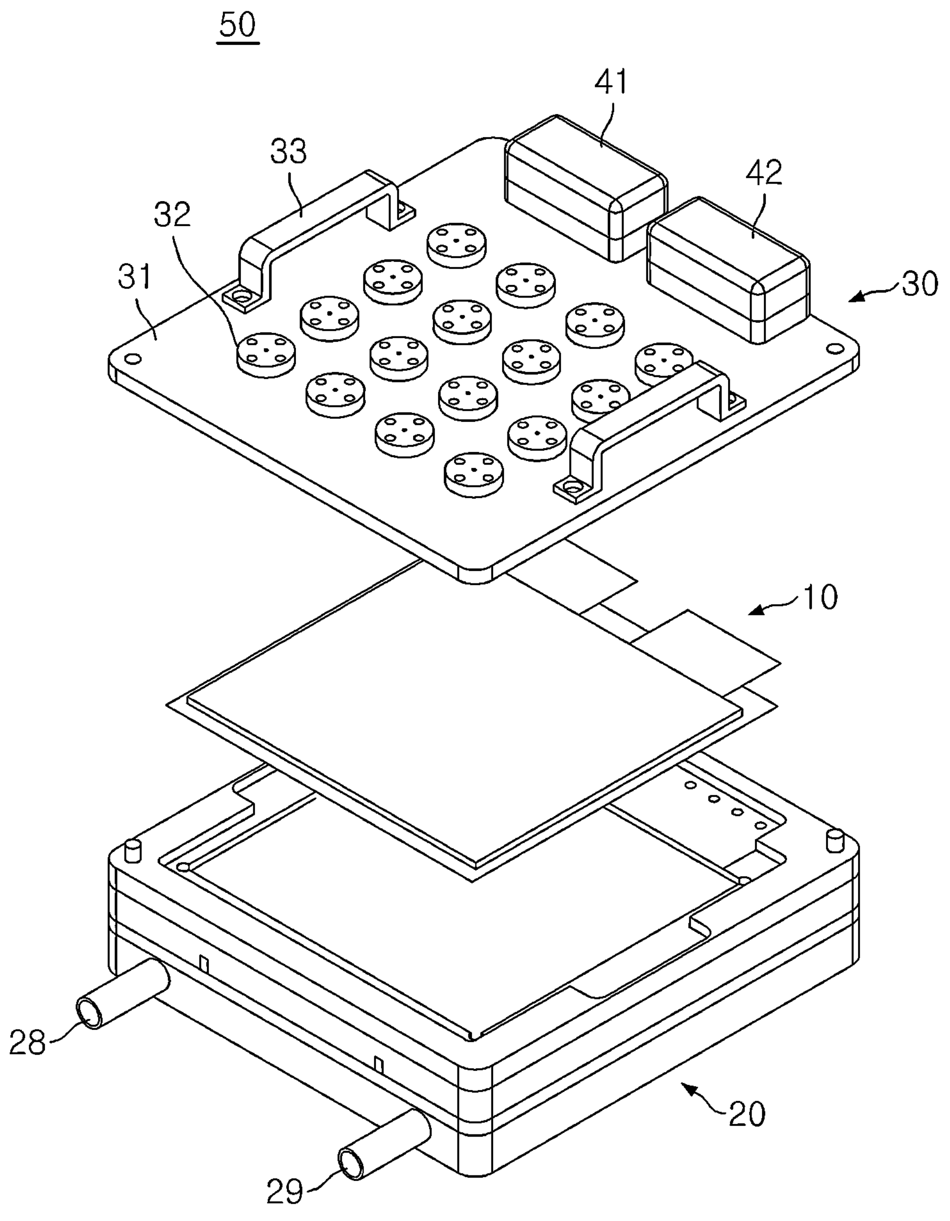
FIG. 4A is a schematic perspective view of a heating/cooling unit and a temperature measuring unit disposed on both upper/lower sides of a secondary battery cell according to an embodiment of the present disclosure.

FIG. 4A is a schematic perspective view of a heating/cooling unit 20 and a temperature measuring unit 30 disposed on both upper/lower sides of a secondary battery cell 10 according to an embodiment of the present disclosure.

Figure 4B:
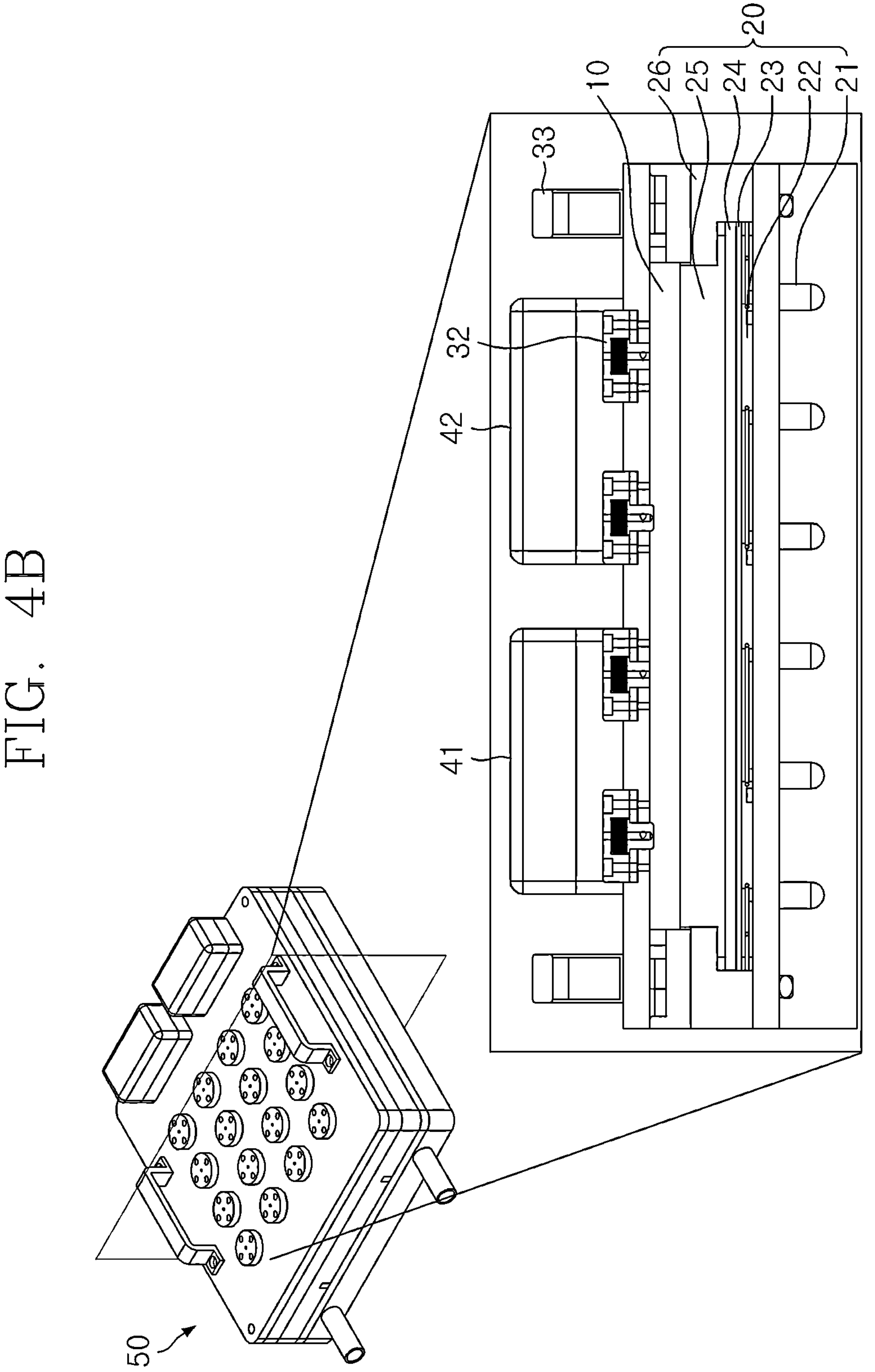
FIG. 4B is a vertical sectional view of a secondary battery cell, a heating/cooling unit, and a temperature measuring unit according to an embodiment of the present disclosure in a coupled state.

FIG. 4B is a vertical sectional view of a secondary battery cell 10, a heating/cooling unit 20, and a temperature measuring unit 30 according to an embodiment of the present disclosure in a coupled state.

Referring to FIG. 4A and FIG. 4B, the secondary battery cell 10 according to an embodiment of the present disclosure is disposed between a heating/cooling unit 20 disposed below the same and a temperature measuring unit 30 disposed above the same. The temperature measuring unit 30 may include pin housings 41, 42 to be connected to the parameter tester 120 through cables. Electrodes (positive electrode, negative electrode) of the secondary battery cell 10 may be connected to the parameter tester 120 through the pin housings 41, 42 (for example, POGO pin housings). In addition, a predetermined control device (not illustrated) may be connected to the heating/cooling unit 20 (for example, Peltier element, cooling means, etc.) and the temperature measuring unit 30 (for example, thermocouple) so as to perform control necessary for the heating/cooling unit 20 and the temperature measuring unit 30.

Figure 4C:
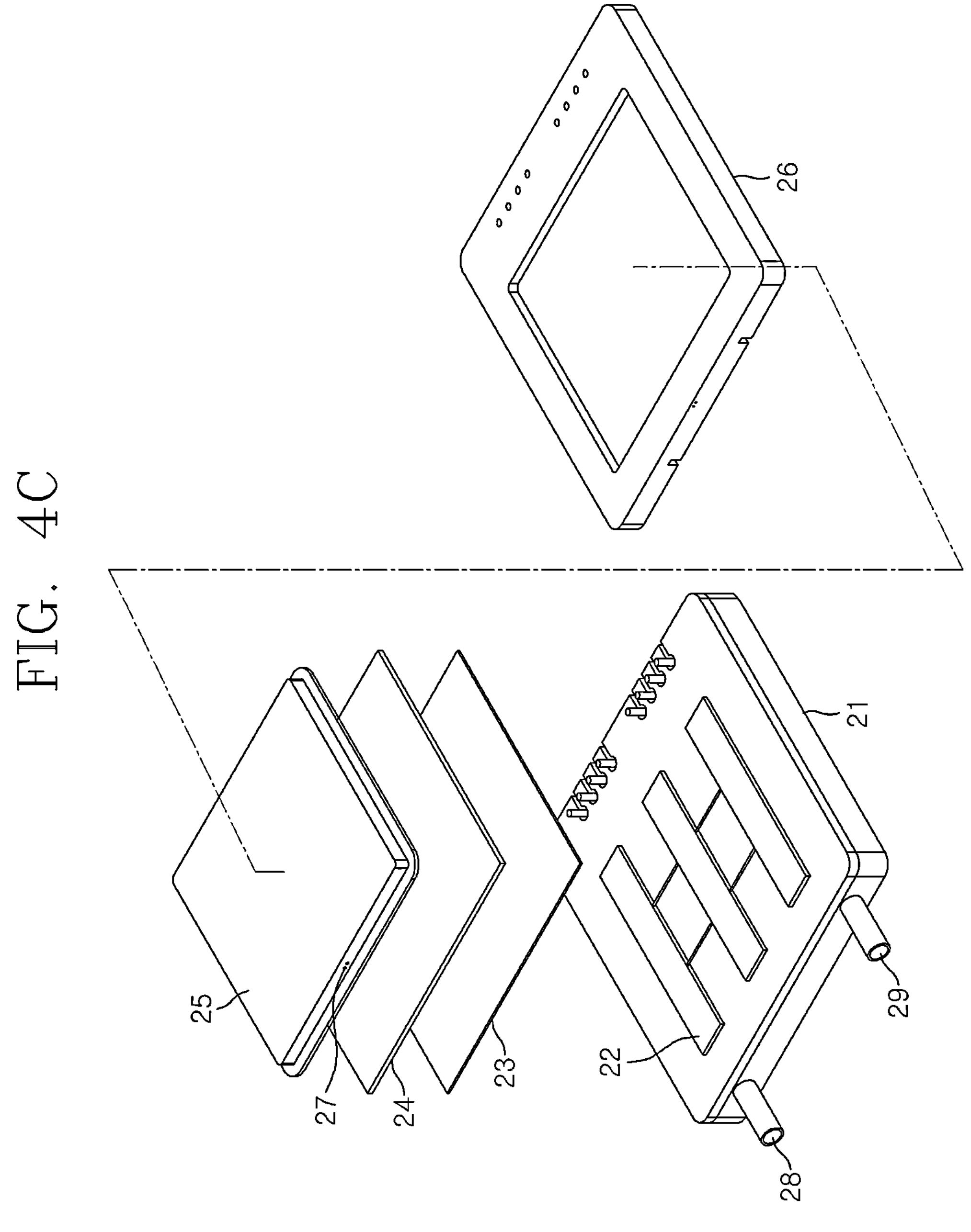
FIG. 4C is a more detailed view of a heating/cooling unit according to an embodiment of the present disclosure.

FIG. 4C is a more detailed view of the heating/cooling unit 20 according to an embodiment of the present disclosure.

Referring to FIG. 4B and FIG. 4C, the heating/cooling unit 20 includes a heat dissipation plate 21, a Peltier element array 22, an aluminum plate 23, a heat diffusion plate 24, a cell heating block 25, and a cover plate 26, which are successively stacked on one another.

In addition, the heating/cooling unit 20 may have a channel formed therein such that a cooling medium flows to the heat dissipation plate 21 or other additional plates. A cooling medium such as cooling water, cooling oil, or cooling gas may circulate through the inlet 28 and the outlet 29 of the channel such that the secondary battery cell 10 is effectively cooled as needed. To this end, the heating/cooling unit 20 may include a cooling medium circulating motor (not illustrated). According to the temperature set in the temperature setup/display unit 140 and the measured temperature of the secondary battery cell 10, a predetermined control device (not illustrated) may control the cooling medium circulating motor to be turned on/off such that the secondary battery cell 10 maintains the setup temperature, and may control the cooling medium so as to enter through the inlet 28 and exit through the outlet 29 and then circulate.

In FIG. 4B and FIG. 4C, the Peltier element array 22 is under the control of the control device, and the control device activates the Peltier element array 22 in response to the temperature set in the temperature setup/display unit 140, thereby heating or cooling the secondary battery cell 10. Peltier elements constituting the Peltier element array 22 may be disposed on the heat dissipation plate 22 in a one-dimensional or two-dimensional array to be spaced apart from each other by a predetermined distance. The Peltier elements have such characteristics that, as an electric current is applied to a point of contact between two metals, one thereof absorbs heat, while the other generates heat, according to the direction of the electric current (Peltier effect), and may be connected to the predetermined control device (not illustrated) through the pin housings 41, 42.

The heat dissipation plate 21 (made of aluminum, for example) disposed below the Peltier element array 22 may have multiple heat dissipation fins facing downwards so as to dissipate heat.

On the upper portion of the Peltier element array 22, an aluminum plate 23 for assisting the Peltier element array 22 in generating or absorbing heat, a heat diffusion plate 24 made of graphite etc. such that heat is diffused effectively, and a cell heating block 25 made of ceramic etc. having excellent thermal conductivity, are included. As in FIG. 4C, a thermocouple 27 may be installed at one or more locations on the cell heating block 25 so as to display the corresponding temperature in the temperature setup/display unit 140 through temperature monitoring.

The upper portion of the cell heating block 25 may be covered by a cover plate 26, the center portion of which is penetrated, and structures of the heating/cooling unit 20 may be protected and retained between the heat dissipation plate 21 and the cover plate 26. The center portion of the cover plate 26, which is penetrated, occupies a larger area than the frame portion of the periphery thereof and to be disposed, and is configured such that the secondary battery cell 10 is disposed on the cell heating block 25.

In FIG. 4A and FIG. 4B, the temperature measuring unit 30 includes an upper plate 31 for fully covering the secondary battery cell 10 on the cell heating block 25, and the upper plate 31 includes handles 33 on both sides thereof. In addition, a thermocouple array 32 is disposed on the upper plate 31.

The thermocouple array 32 may generate a measurement signal regarding the secondary battery cell 10, that is, a signal that serves as a basis of measuring local temperature of each part with regard to the entire upper surface of the secondary battery cell 10. To this end, the thermocouple array 32 may include thermocouples disposed in a two-dimensional array so as to be spaced part from each other. The thermocouple array 32 may be connected to a predetermined control device (not illustrated) through the pin housings 41, 42, and under the control of the predetermined control device (not illustrated), the thermocouple array 32 may transmit a measurement signal regarding the secondary battery cell 10 to the predetermined control device (not illustrated).

Figure 5A:
FIG. 5A is an exploded perspective view of a jig according to another embodiment of the present disclosure.
Figure 5A:
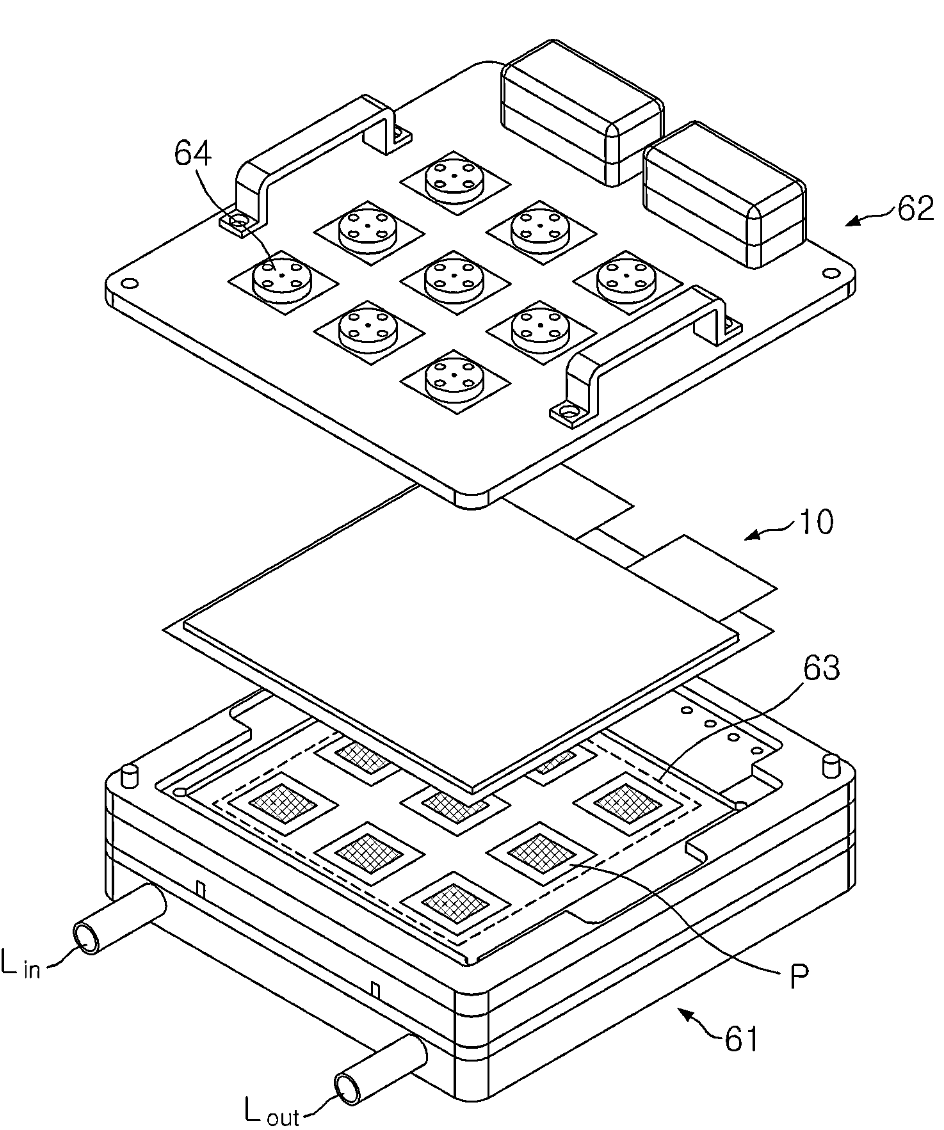
Figure 5B:
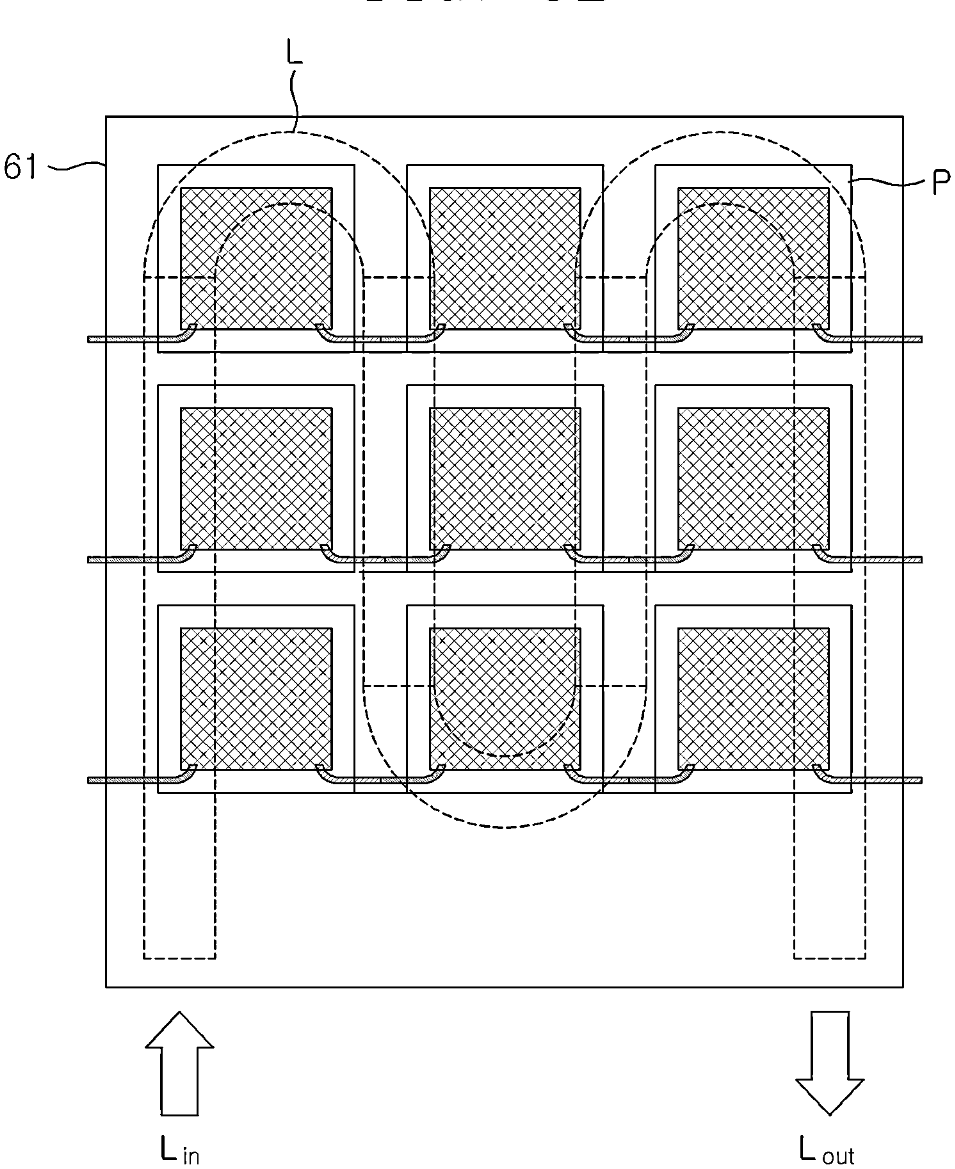
FIG. 5B illustrates a Peltier element array of a jig according to another embodiment of the present disclosure.
Figure 5C:
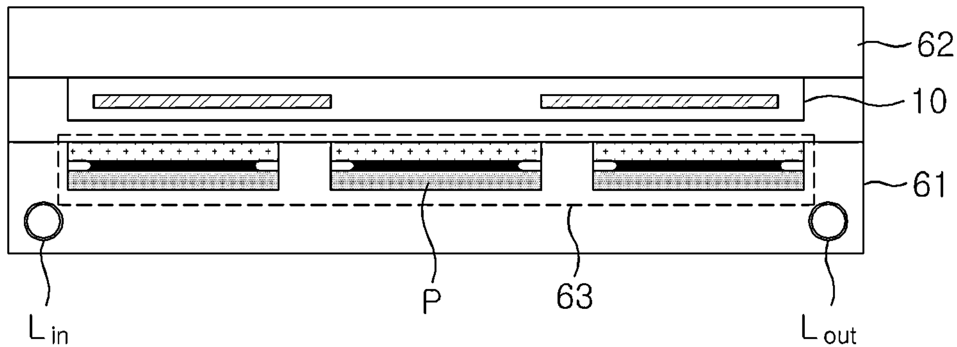
FIG. 5C is a vertical sectional view of a jig according to another embodiment of the present disclosure.

FIG. 5A to FIG. 5C illustrate a jig 60 according to another embodiment of the present disclosure.

Referring to FIG. 5A, the jig 60 according to another embodiment of the present disclosure may include a plate 61, a cover portion 62, and a Peltier element array 63.

A secondary battery cell 10 may be seated on the upper portion of the plate 51, and the secondary battery cell 10 may then be mounted therein through coupling with the cover portion 62. In addition, the plate 61 may be provided with a Peltier element array 63 such that the Peltier element array 63 and the secondary battery cell 10 make direct contact.

In addition, as illustrated in FIG. 5B, a cooling channel L may be further provided inside the plate 61 so as to extend below the Peltier element array 63. That is, the Peltier element array 63 may be cooled to improve the efficiency of the Peltier element array 63, and a cooling medium such as cooling water, cooling oil, cooling gas, etc. may circulate inside the cooling channel L to this end. In some embodiments, a feature such as a cooling fan or a heat dissipation plate (not illustrated) may be provided below the plate 61.

The cover portion 62 may be coupled to the plate 61 so as to cover and retain the secondary battery cell 10. The cover portion 62 may further include a temperature measuring unit 64 for measuring the temperature of the secondary battery cell 10. The temperature measuring unit 64 may be positioned at a predetermined point on the secondary battery cell 10 corresponding to the position of each Peltier element P, thereby generating a measured temperature.

The Peltier element array 63 may be provided on the plate portion 61, and multiple Peltier elements may be arranged thereon so as to heat or cool the secondary battery cell 10. As illustrated in FIG. 5B, the Peltier element array 63 may be implemented by arranging multiple Peltier element P in an N×M shape (N, M are natural numbers identical or different from each other), and the multiple Peltier elements P may perform heat transfer by conduction through contact with the secondary battery cell 10. The Peltier element array 63 may be implemented by spatially arranging multiple Peltier elements P according to the size of the secondary battery cell 10.

That is, when the chamber 110 is used, temperature is controlled by heating the air inside the chamber 110 with a heater such that convection occurs. Uniform temperature control may be difficult, depending on the shape of the secondary battery cell 10, and structures such as the chamber 110 and the heater need to be included, thereby posing a problem in that the overall volume is increased, for example.

In contrast, the jig 60 according to an embodiment of the present disclosure may be implemented in a compact structure confirming to the size of the secondary battery cell 10 as illustrated in FIG. 5A to FIG. 5C, and more precise and uniform temperature control can be performed because heat transfer occurs through direct contact with the secondary battery cell 10.

Figure 6:
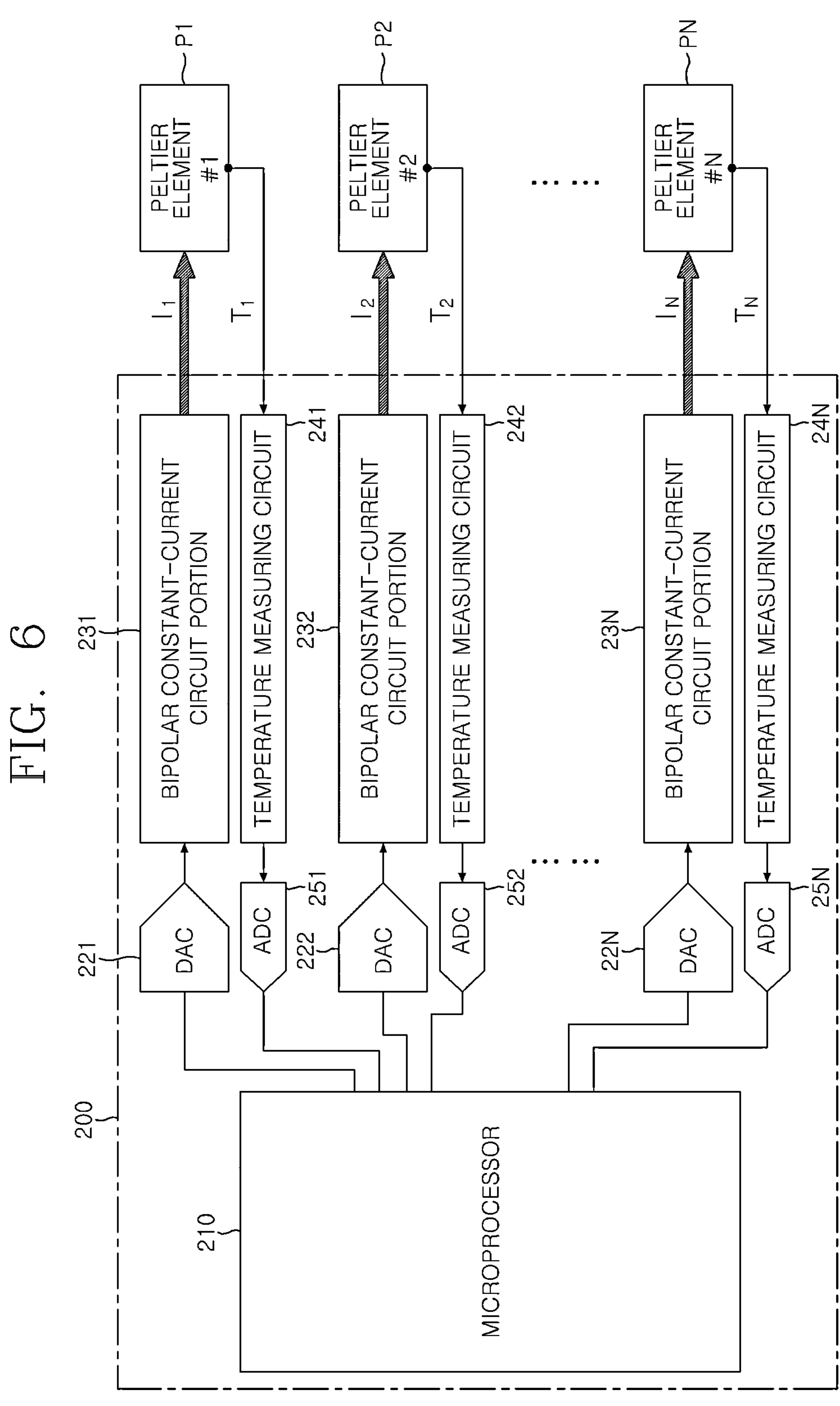
FIG. 6 is a block diagram illustrating a power driving device for supplying power to a jig according to an embodiment of the present disclosure.

FIG. 6 is a block diagram illustrating a power driving device 200 regarding a Peltier array 63 according to an embodiment of the present disclosure. The power driving device 200 may include a microprocessor 210, digital analog converters (DAC) 221 to 22N, bipolar constant-current circuit portions 231 to 23N, temperature measuring circuits 241 to 24N, analog digital converters (ADC) 251 to 25N, etc.

The power driving device 200 may control respective Peltier elements P in a constant-current control type, and a bipolar circuit structure may be applied such that heating and cooling regarding the Peltier elements P can be easily controlled.

Specifically, the power driving device 200 may transmit a control signal regarding respective Peltier elements P1 to PN by using the DACs 221 to 22N, and the bipolar constant-current circuit portions may set respective input currents I1 to IN according to the control signal. Thereof, if a measured temperature inside the secondary battery cell 10 is input according to the input current I1 to IN, the temperature measuring circuits 241 to 24N may transfer the measured temperature to the microprocessor 210 through the ADCs 251 to 25N, and the microprocessor 210 may reset the input current value according to the measured temperature.

The microprocessor 210 may apply proportional integral derivation (PID) control to respective Peltier elements P1 to PN. The microprocessor 210 may set input currents I1 to IN regarding respective Peltier elements P1 to PN according to temperatures $T_1$ to $T_N$ measured by the temperature measuring unit 64 in response to heating in respective Peltier elements P1 to PN.

In connection with applying the PID control algorithm, the microprocessor 210 may control individual Peltier elements P by using measured temperatures $T_1$ to $T_N$ of the secondary battery cell 10 corresponding to respective Peltier elements P, or may simultaneously control all Peltier elements P by using the average temperature of the secondary battery cell 10 regarding the entire Peltier element array 64. It is also possible to use individual control and average control in a combined manner, in some embodiments.

Specifically, an equation for PID control may be expressed as follows:

$$u(t) = K_p e(t) + K_i \int_0^t e(t')dt' + K_d \frac{de(t)}{dt}$$

wherein u(t) denotes the degree of increase/decrease in input current value $I_{set}$ input to each Peltier element P; e(t)

denotes a difference value between the setup temperature $T_{set}$ and measured temperature $T_N$; $K_p$ denotes a proportional coefficient; $K_i$ denotes an integral coefficient; and $K_d$ denotes a differential coefficient.

In the case of an average control type, $(T_1(t)+T_2(t)+\ldots+T_N(t))/N=T_\alpha(t)$ may be used to obtain the average temperature $T_\alpha(t)$ which is the average value of temperatures measured by respective Peltier elements P, and $T_\alpha(t)-T_{set}(t)=e(t)$ may be used to determine that the difference between the average temperature $T_\alpha(t)$ and the setup temperature $T_{set}(t)$ is e(t). That is, the same input current value $I_{set}$ may be set for all Peltier elements P, heer and control coefficients may set such that, by assigning weights to the proportional coefficient, the secondary battery cell 10 quickly reaches the setup temperature.

In addition, in the case of an individual control type, PID control may be performed individually with regard to each Peltier element P. That is, $T_1(t)-T_{set}(t)=e_1(t)$, $T_2(t)-T_{set}(t)=e_2(t), \ldots, T_N(t)-T_{set}(t)=e_N(t)$ may be used to set e(t) which is the difference value between the setup temperature and measured temperature with regard to each Peltier element P, and $K_p$, $K_i$, $K_d$ may be obtained therefrom with regard to each Peltier element P. In this case, input current values $I_{set}$ regarding respective Peltier elements P may have differently set sizes, and control coefficients may set such that, by assigning weights to the integral coefficient and differential coefficient, the secondary battery cell 10 reaches a uniform temperature.

Figure 7:
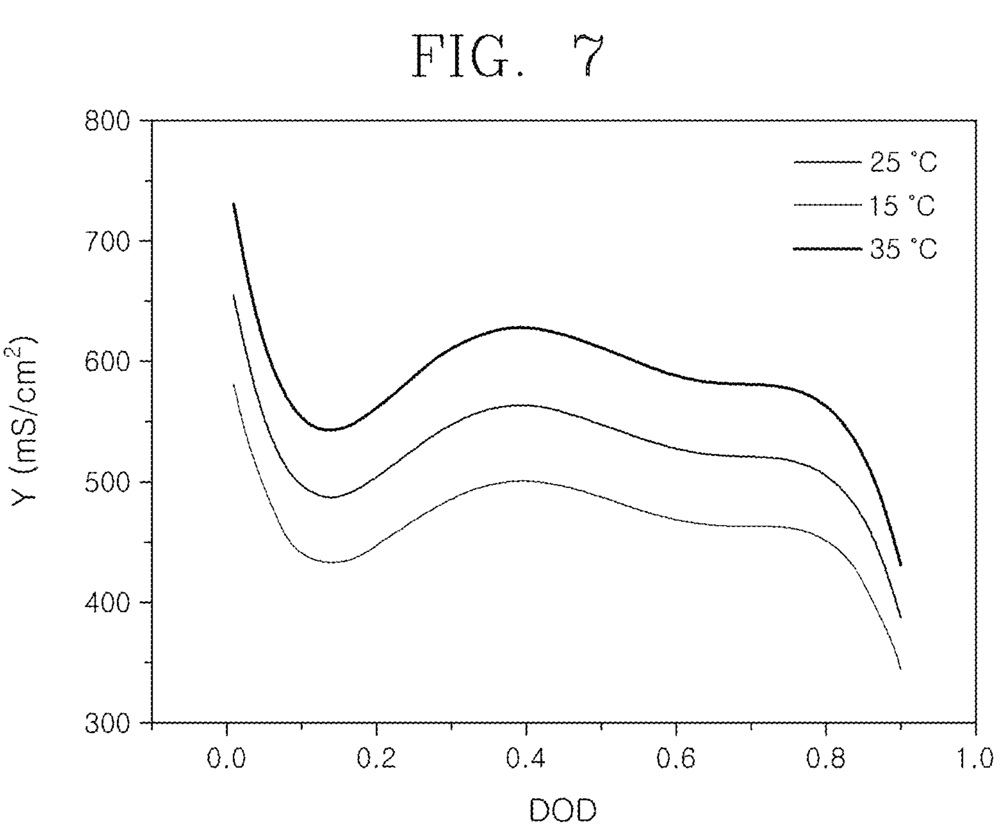
FIG. 7 illustrates a temperature-dependent change curve of cell conductance Y according to DOP among parameter information regarding performance, heating, and deterioration which may be acquired from test data resulting from measurement by a parameter tester 120 according to the present disclosure.

FIG. 7 illustrates a temperature-dependent change curve of cell conductance Y according to the depth of discharge (DOD) among parameter information regarding performance, heating, and deterioration which may be acquired from test data resulting from measurement by a parameter tester 120 according to the present disclosure.

As in FIG. 7, similarly to the scheme of acquiring cell conductance Y ($mS/cm^2$) parameters of the secondary battery cell 10 with regard to the depth of discharge (DOD) per temperature 15, 25, 35° C. in the parameter tester 120, parameters related to parameter information regarding performance (cell open circuit voltage U, capacity Q, etc.), heating (cell capacitance $C_{dl}$, cell entropy ΔS, etc.), external temperature influence (C1, C2), and deterioration (A1, A2) may be acquired, thereby performing a simulation regarding the secondary battery cell 10.

Figure 8:
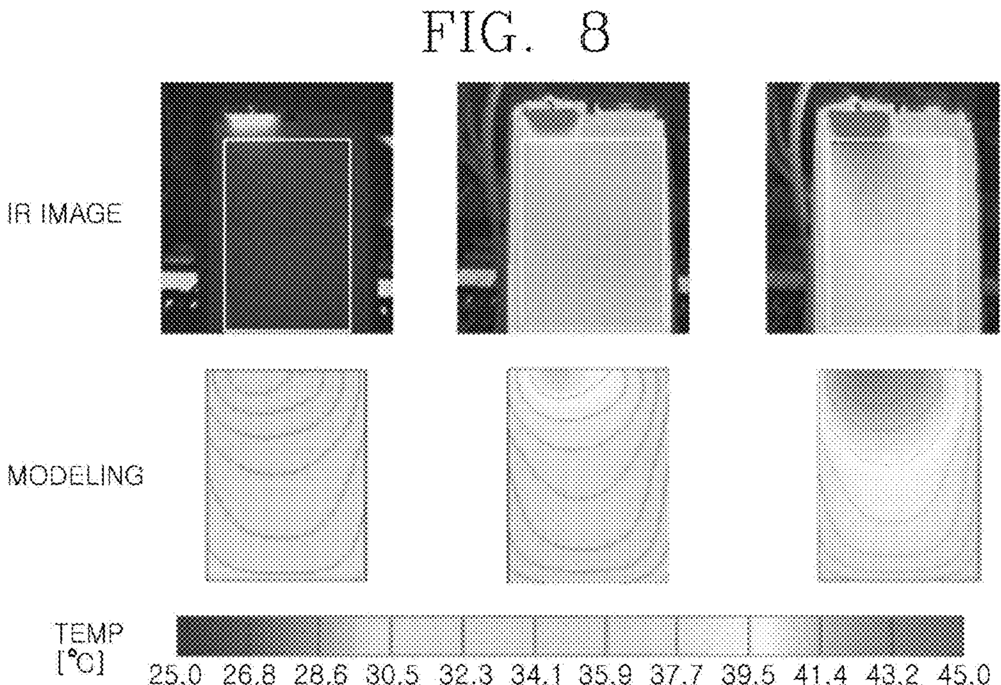
FIG. 8 illustrates a comparison between a temperature distribution according to a heating prediction result, among behavior information regarding performance, heating, and deterioration obtained through a simulation in a data processing device of the present disclosure, and a temperature distribution acquired through actual measurement by an infrared camera.

FIG. 8 illustrates a comparison between a temperature distribution (Modeling) according to a heating prediction result, among behavior information regarding performance, heating, and deterioration obtained through a simulation in a data processing device of the present disclosure, and a temperature distribution (IR image) acquired through actual measurement by an infrared camera 150. The distribution of temperature actually measured by the infrared camera 150 is illustrated therein, and it may be confirmed that the thermocouple array 32 of the temperature measuring unit 30 may be used to acquire a similar actually measured temperature distribution.

As in FIG. 8, the data processing device 130 can predict a two-dimensional or three-dimensional temperature distribution etc. by analyzing the above-mentioned parameter information from the parameter tester 120, that is, performance (cell open circuit voltage U, capacity Q, etc.), heating (cell conductance Y, cell capacitance $C_{dl}$, cell entropy ΔS, etc.), and deterioration (A1, A2) with regard to a semi-empirical electrochemical-thermal model (NTGK model etc.) regarding the secondary battery cell 10.

Besides, the data processing device 130 may obtain behavior information regarding performance, heating, and deterioration such as charging/discharging patterns, the number of cycles, the time of use, an open circuit voltage (OCV)-capacity curve according to environment temperature, a closed circuit voltage (CCV)-capacity curve, remaining lifespan (RUL), etc. by means of behavior analysis through a semi-empirical electrochemical-thermal model (NTGK model etc.) regarding the secondary battery cell 10. To this end, "discharge voltage/number of cycles" (the larger the number of cycles, the smaller the discharge voltage) etc. may be analyzed through a formation cycle test regarding the secondary battery cell 10, for example; "dischargeable capacity (Ah)/number of cycles" (the larger the number of cycles, the smaller the dischargeable capacity voltage) etc. may be analyzed through a long cycle test; or "dischargeable capacity (Ah)/discharge time" (the shorter the discharge time, the smaller the dischargeable capacity) etc. may be analyzed through a C-rate test.

Figure 9:
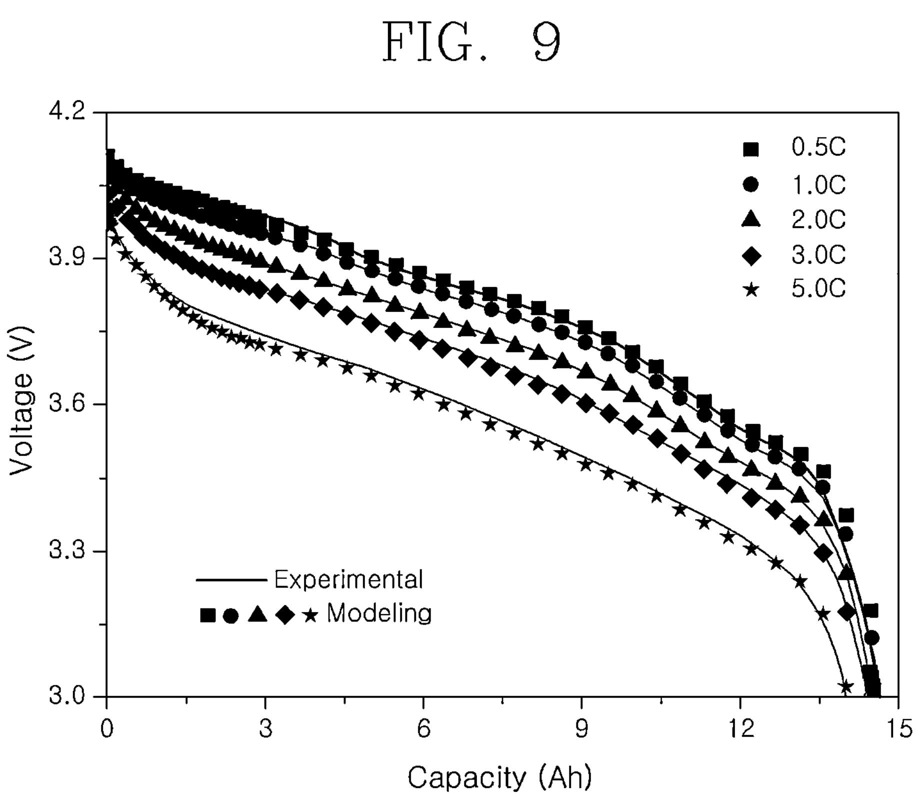
FIG. 9 illustrates a comparison between a discharge curve prediction result according to the C-rate among behavior information regarding performance, heating, and deterioration obtained by a data processing device of the present disclosure and an experimentally measured discharge curve.

FIG. 9 illustrates a comparison between a discharge curve prediction result (Modeling) according to the C-rate among behavior information regarding performance, heating, and deterioration obtained by a data processing device 130 of the present disclosure and an experimentally measured discharge curve (Experimental).

As is clear from the discharge pattern indicating the voltage of the secondary battery cell 10 regarding the capacity (Ah) with regard to each C-rate (0.5-5.0) in FIG. 9, the discharge pattern (Modeling) predicted according to the present disclosure is applicable as a useful feedback system, through a design change, to various types of secondary batteries such as a lithium secondary battery, a lead storage battery, a redox flow battery, etc.

The above-mentioned test bed envisioned by the present disclosure can not only predict the lifespan of a battery which is being developed or newly fabricated, but also used as a tool for evaluating the performance of batteries that undergo abnormal behavior and finding out the cause of the abnormal behavior. Therefore, the same can be used as such a type of test device that can substantially help users and developers in the battery manufacturing industry.

That is, the system proposed by the present disclosure may be implemented by designing a virtual secondary battery cell 10 through simulation, extracting initial parameter information by analyzing characteristics of an actual secondary battery cell 10, the lifespan of which is to be predicted, and automatically inputting the extracted information. In this case, the user can develop secondary batteries or predict the lifespan of a secondary battery that undergoes abnormal behavior, through a single test platform, without performing multiple experiments.

Figure 10:
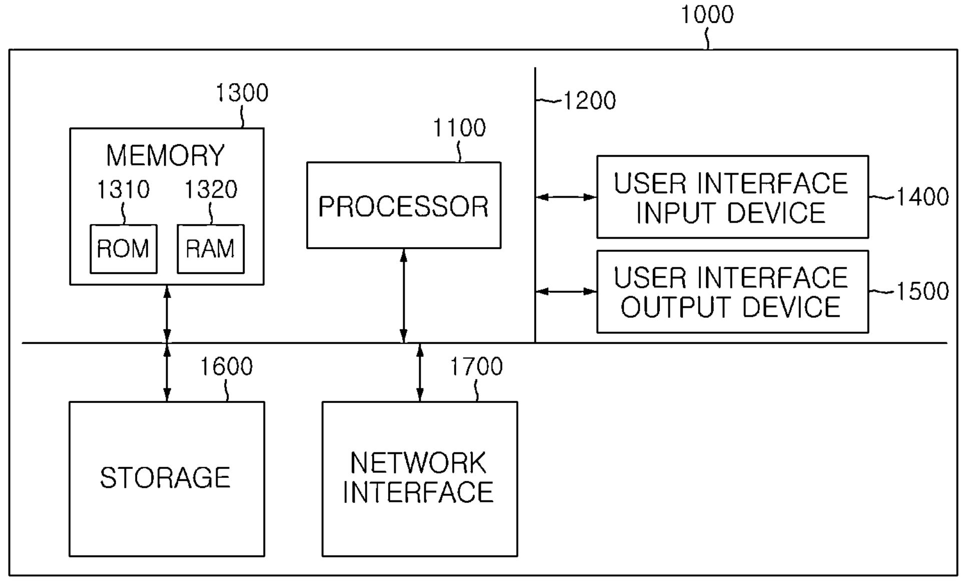
FIG. 10 illustrates an exemplary method for implementing a secondary battery behavior prediction system according to an embodiment of the present disclosure.

FIG. 10 illustrates an exemplary method for implementing a secondary battery behavior prediction system 100 according to an embodiment of the present disclosure.

The secondary battery behavior prediction system 100 configured to process behavior analysis based on secondary battery parameter measurement according to an embodiment of the present disclosure may be configured to hardware, software, or a combination thereof. For example, the secondary battery behavior prediction system 100 of the present disclosure, particularly, the parameter tester 120, the data processing device 130, the control device (not illustrated), etc. may be implemented as a computing system 1000 as in FIG. 8, which has at least one processor for performing the above-mentioned functions/steps/processes, or as an Internet-based server.

The computing system 1000 may include at least one processor 1100, a memory 1300, a user interface input device 1400, a user interface output device 1500, a storage 1600, and a network interface 1700, which are connected through a bus 1200. The processor 1100 may be a semiconductor device for executing processing regarding instructions stored in the CPU, memory 1300, and/or storage 1600. The memory 1300 and storage 1600 may include various kinds of volatile or nonvolatile storage media. For example, the memory 1300 may include a read only memory (ROM) 1310 and a random access memory (RAM) 1320.

Therefore, steps of a method or an algorithm described in connection with embodiments disclosed herein may be directly implemented by hardware executed by the processor 1100, a software module, or a combination of the two. The software module may reside in a storage/recording medium (that is, memory 1300 and/or storage 1600) that can be read by a computer or other devices, such as a RAM memory, a flash memory, a ROM memory, an EPROM memory, an EEPROM memory, a register, a hard disk, a detachable disk, a CD-ROM. An exemplary storage medium may be coupled to the processor 1100, and the processor 1100 may read information from the storage medium and may write information in the storage medium. In another method, the storage medium may be integrated with the processor 1100. The processor and the storage medium may reside in an application-specific integrated circuit (ΔSIC). The ΔSIC may reside in a user terminal. In another method, the processor and the storage medium may reside in the user terminal as individual components.

As described above, according to the secondary battery behavior prediction system 100 according to the present disclosure, by providing a test platform (hardware+software) capable of predicting charging/discharging characteristics, heating characteristics, and deterioration characteristics of a commercially available secondary battery cell, thermal analysis of the secondary battery may be performed by actually measuring parameters from a parameter tester such that the configuration of a module, pack, or rack can be easily designed through serial/parallel disposition of cells, thereby predicting behavior such as heating and deterioration characteristics. This provides secondary battery technical innovation such as an increased number of times of charging/discharging regarding secondary batteries, increased output density and stability, improved low-temperature characteristics, and increased rapid charging current, and guides next-generation battery development. Moreover, a tool may be provided such that technical dominance is ensured in the ever-accelerating global competition in the battery industry.

Although the present disclosure has been described above with regard to specific features, such as specific components, and limited embodiments and drawings, such descriptions are only for helping more general understanding of the present disclosure, and the present disclosure is not limited to such embodiments. Various changes and modifications will be possible by those skilled in the art to which the present disclosure pertains without deviating from the gist of the present disclosure. Therefore, the idea of the present disclosure is not to be construed as being limited to the above-mentioned embodiments, and not only the accompanying claims, but also all technical ideas equivalent to the claims or equivalently modified are to be interpreted as being included in the scope of the present disclosure.

The invention claimed is:

1. A secondary battery behavior simulation system comprising:

a jig comprising a heating/cooling unit controlled by a control device according to a temperature setup, and a temperature measuring unit configured to transmit a measurement signal regarding a temperature of a secondary battery cell to the control device for temperature monitoring, wherein the secondary battery cell is disposed between the heating/cooling unit and the temperature measuring unit;

a parameter tester connected to the secondary battery cell and configured to obtain parameter information of the secondary battery cell based on data measured while controlling operations of the secondary battery cell, wherein when the temperature of the secondary battery cell reaches a setup temperature, the parameter tester controls the operations of the secondary battery cell using a unit for electrochemical characteristic evaluation;

a basic parameter database configured to store basic parameter information including structural and material properties of the secondary battery cell which is derived from a geometric structure and constituent materials of the secondary battery cell; and a data processing device configured to:

receive the parameter information and the basic parameter information, simulate electrochemical and thermal behavior of the secondary battery cell by applying the parameter information and the basic parameter information to a semi-empirical electrochemical-thermal model, and generate behavior information of the secondary battery cell, the behavior information comprising:

at least one of an open circuit voltage (OCV)-capacity curve according to environment temperature, a closed circuit voltage (CCV)-capacity curve, a remaining useful life (RUL), and a two-dimensional or three-dimensional temperature distribution of the secondary battery cell.

2. The secondary battery behavior simulation system of claim 1, wherein the secondary battery behavior simulation system further comprises a temperature setup/display unit for temperature setup and temperature display regarding the secondary battery cell.

3. The secondary battery behavior simulation system of claim 2, wherein the secondary battery behavior simulation system further comprises a jig comprising a heating/cooling unit controlled by a control device according to the temperature setup and a temperature measuring unit configured to transmit a measurement signal regarding the secondary battery cell for the temperature display to the control device, and the secondary battery cell is disposed between the heating/cooling unit and the temperature measuring unit.

4. The secondary battery behavior simulation system of claim 3, wherein the heating/cooling unit disposed below the secondary battery cell comprises a Peltier element array configured to operate in response to the temperature setup, and the temperature measuring unit disposed above the secondary battery cell comprises a thermocouple array configured to generate a signal serving as a basis of local temperature measurement of the secondary battery cell.

5. The secondary battery behavior simulation system of claim 3, wherein the heating/cooling unit comprises a cooling medium circulating motor subjected to operation control of the control device according to a measurement temperature regarding the secondary battery cell, and the cooling medium circulating motor circulates a cooling medium through a channel inside the jig according to the operation control.

6. The secondary battery behavior simulation system of claim 4, wherein the heating/cooling unit comprises:

a heat dissipation plate disposed below the Peltier element array; and an aluminum plate, a heat diffusion plate, and a cell heating block stacked above the Peltier element array.

7. The secondary battery behavior simulation system of claim 6, wherein the heating/cooling unit further comprises a thermocouple installed on the cell heating block so as to display a corresponding temperature on the temperature setup/display unit through temperature monitoring.

8. The secondary battery behavior simulation system of claim 2, wherein the secondary battery behavior simulation system further comprises a chamber configured to contain the secondary battery cell, and the temperature inside the chamber is maintained by controlling activation of a heater or a cooling device installed around the chamber according to the temperature setup.

9. The secondary battery behavior simulation system of claim 1, wherein the parameter tester acquires the parameter information by using a series of time-dependent charging/discharging patterns of the secondary battery cell with regard to two or more time-dependent current conditions.

10. The secondary battery behavior simulation system of claim 9, wherein the parameter tester acquires the parameter information with regard to the two or more time-dependent current conditions for each setup temperature with regard to multiple setup temperatures.

11. The secondary battery behavior simulation system of claim 1, wherein the parameter information comprises one or more pieces of parameter information among parameter information regarding cell open circuit voltage (U), capacity (Q), cell conductance (Y), cell capacitance ($C_{dl}$), cell entropy ($\Delta S$), external temperature influence (C1, C2), and deterioration (A1, A2).

12. The secondary battery behavior simulation system of claim 1, wherein the basic parameter information comprises at least one of density ($\rho$), specific heat ($C_p$), thermal conductivity (k), electrode plate resistance ($r_p$, $r_n$), specific surface area (a, $a_p$, $a_n$), heat transfer coefficient associated with a temperature measuring unit regarding the secondary battery cell.

* * * * *